United States Patent
Kawauchi et al.

(10) Patent No.: US 10,720,897 B2
(45) Date of Patent: Jul. 21, 2020

(54) PROCESSING DEVICE, SERVER DEVICE, OUTPUT METHOD, AND NON-TRANSITORY STORAGE MEDIUM

(71) Applicant: PIONEER CORPORATION, Bunkyo-ku, Tokyo (JP)

(72) Inventors: Hiroto Kawauchi, Kawagoe (JP); Yoichi Okuyama, Kawagoe (JP); Akimitsu Fujiyoshi, Kawagoe (JP)

(73) Assignee: PIONEER CORPORATION, Bunkyo-Ku, Tokyo (JP)

( * ) Notice: Subject to any disclaimer, the term of this patent is extended or adjusted under 35 U.S.C. 154(b) by 0 days.

(21) Appl. No.: 16/345,200

(22) PCT Filed: Oct. 25, 2017

(86) PCT No.: PCT/JP2017/038573
§ 371 (c)(1),
(2) Date: Apr. 25, 2019

(87) PCT Pub. No.: WO2018/079624
PCT Pub. Date: May 3, 2018

(65) Prior Publication Data
US 2019/0280664 A1 Sep. 12, 2019

(30) Foreign Application Priority Data
Oct. 25, 2016 (JP) .............................. 2016-208427

(51) Int. Cl.
*H04R 1/40* (2006.01)
*H03G 3/30* (2006.01)
(Continued)

(52) U.S. Cl.
CPC ........... *H03G 3/3005* (2013.01); *B60R 11/02* (2013.01); *B60R 11/0217* (2013.01);
(Continued)

(58) Field of Classification Search
CPC ............... G10K 2210/1282; G10K 2210/3221
See application file for complete search history.

(56) References Cited

U.S. PATENT DOCUMENTS

| 8,872,671 B2 | 10/2014 | Katayama |
| 2013/0187793 A1 | 7/2013 | Katayama |
| 2013/0188794 A1 | 7/2013 | Kawamata et al. |

FOREIGN PATENT DOCUMENTS

| JP | 2008-035472 A | 2/2008 |
| JP | 2008-239099 A | 10/2008 |

(Continued)

OTHER PUBLICATIONS

International Search Report for related International Application No. PCT/JP2017/038573, dated Jan. 23, 2018, 2 pages.

*Primary Examiner* — Kile O Blair
(74) *Attorney, Agent, or Firm* — Procopio, Cory, Hargreaves & Savitch LLP

(57) ABSTRACT

According to the present invention, there is provided a processing device (10) which includes a sound collection unit (11) that collects an environmental sound outside a vehicle with plural microphones and a processing unit (12) that amplifies the environmental sound collected by the sound collection unit (11) and causes the amplified sound to be output to an inside of the vehicle. The processing unit (12) sets an amplification factor of the environmental sound collected by some microphones to be different from an amplification factor of the environmental sound collected by other microphones.

7 Claims, 7 Drawing Sheets

(51) Int. Cl.
*H04W 4/44* (2018.01)
*H04W 4/029* (2018.01)
*B60R 11/02* (2006.01)
*H04R 3/00* (2006.01)
*H04R 3/04* (2006.01)
*H04R 29/00* (2006.01)
*G08G 1/16* (2006.01)
*G08G 1/0962* (2006.01)

(52) U.S. Cl.
CPC .............. *G08G 1/0962* (2013.01); *G08G 1/16* (2013.01); *H04R 1/406* (2013.01); *H04R 3/00* (2013.01); *H04R 3/005* (2013.01); *H04R 3/04* (2013.01); *H04R 29/001* (2013.01); *H04W 4/029* (2018.02); *H04W 4/44* (2018.02); *H03G 2201/103* (2013.01); *H04R 2499/13* (2013.01)

(56) References Cited

FOREIGN PATENT DOCUMENTS

| | | |
|---|---|---|
| JP | 2009-051333 A | 3/2009 |
| JP | 2009-251799 A | 10/2009 |
| JP | 2009-258802 A | 11/2009 |
| JP | 2011-232293 A | 11/2011 |
| JP | 2011-233090 A | 11/2011 |
| JP | 2013-149080 A | 8/2013 |
| JP | 2015-032155 A | 2/2015 |

FIG. 3

| POSITION ATTRIBUTE | FILTER ID |
|---|---|
| SCHOOL ZONE | F00001 |
| BICYCLE TRAFFIC VOLUME IS LARGE | F00002 |
| ALONG THE SEASIDE | F00003 |
| SONG OF BIRD IS HEARD | F00004 |
| ⋮ | ⋮ |

US 10,720,897 B2

PROCESSING DEVICE, SERVER DEVICE, OUTPUT METHOD, AND NON-TRANSITORY STORAGE MEDIUM

CROSS-REFERENCE TO RELATED APPLICATIONS

This application is a U.S. National Stage entry of PCT Application No: PCT/JP2017/038573 filed Oct. 25, 2017, which claims priority to Japanese Patent Application No. 2016-208427, filed Oct. 25, 2016, the contents of which are incorporated herein by reference.

TECHNICAL FIELD

The present invention relates to a processing device, a server device, an output method, and a program.

BACKGROUND ART

Patent Document 1 discloses a device that collects an ambient sound outside a car with a sound collector and presents the collected sound. The device can present a sound obtained by suppressing an ambient sound in a moving direction of a vehicle, present a sound obtained by suppressing an ambient sound in a direction of a sight line of a driver, present a sound obtained by suppressing a frequency band of running noise in the car, adjust a sound pressure level in accordance with vehicle speed information, or start presenting a sound in response to detection of a mobile sound source.

Patent Document 2 discloses a system in which a sound generation device provided for an ambulance, a fire engine, a railroad cross, and the like and an in-vehicle audio notification device that notifies the inside of the car of a sound generated outside the car are provided. The sound generation device outputs a predetermined sound on the basis of a signal obtained by superimposing identification information indicating the type of an audio signal on the audio signal. The in-vehicle audio notification device extracts the identification information from the collected audio signal. The in-vehicle audio notification device determines whether a notification for the inside of the car is performed, on the basis of the extracted identification information.

Patent Document 3 discloses a device that collects an ambient sound outside a vehicle with a sound collector and presents the collected sound. The device detects an object around the own vehicle. In a case where the object is detected, the device presents a predetermined sound. In a case where the object is not detected, the device does not present the predetermined sound. The predetermined sound is obtained by synthesizing a sound collected by a microphone and a virtual sound generated by the device. In a case where the detected object is an object that makes a sound, the detection of the object is notified by the sound collected by the microphone. In a case where the detected object is an object that does not make a sound, the detection of the object is notified performed by the virtual sound.

Patent Document 4 discloses a device that detects an approaching vehicle approaching the own vehicle, on the basis of the collected sound outside the vehicle. The device detects the shape of a traveling road on which the own vehicle travels, the type of a road surface of the traveling road on which the approaching vehicle travels and adjusts sound collection characteristics on the basis of the detection result.

RELATED DOCUMENT

Patent Document

[Patent Document 1] JP-A-2009-258802
[Patent Document 2] JP-A-2015-32155
[Patent Document 3] JP-A-2009-251799
[Patent Document 4] JP-A-2011-232293

SUMMARY OF THE INVENTION

Technical Problem

According to the technologies disclosed in Patent Documents 1 to 4, it is possible to notify a driver of sound around the own vehicle. However, various kinds of sound are mixedly provided around the own vehicle. Among these kinds of sound, a sound of which notification to a driver is desired and a sound of which notification to the driver is unnecessary are mixedly provided. In a case where a sound outside a vehicle is simply collected to be output from a speaker in the vehicle, the sound of which notification to a driver is desired and the sound of which notification to the driver is unnecessary are mixed in the sound of which the driver is notified. As a result, a problem that the driver misses the sound of which notification to the driver is desired may occur.

One example of objects of the present invention is to provide a technology of reducing such a problem which may occur in a system of notifying a driver of a sound around the own vehicle.

Solution to Problem

According to the invention described in claim 1, there is provided a processing device includes a sound collection unit that collects an environmental sound outside a vehicle with plural microphones, and a processing unit that amplifies the environmental sound collected by the sound collection unit and causes the amplified sound to be output to an inside of the vehicle. The processing unit sets an amplification factor of the environmental sound collected by some microphones to be different from an amplification factor of the environmental sound collected by other microphones.

According to the invention described in claim 6, there is provided a server device includes an acquisition unit that acquires, from plural vehicles, position information of a vehicle, information of an amplification factor of an environmental sound set at a position indicated by the position information, information of a microphone for which the amplification factor is set, information of a position relation between the vehicle and the environmental sound, and condition information including at least one of a surrounding environment and date and time when the vehicle is located at the position, a generation unit that generates reference information including an amplification factor set at a predetermined position, a microphone as a target for which the amplification factor is set, and a condition for setting the amplification factor, on the basis of the information acquired by the acquisition unit, and a determination unit that determines the amplification factor which is set for another vehicle, on the basis of the position information and the condition information transmitted from the other vehicle and the reference information.

According to the invention described in claim 7, there is provided an output method executed by a computer, the method including a sound collection step of collecting an environmental sound outside a vehicle with plural microphones, and a processing step of amplifying the environmental sound collected by the sound collection unit and causing the amplified sound to be output to an inside of the vehicle. In the processing step, an amplification factor of the environmental sound collected by some microphones is set to be different from an amplification factor of the environmental sound collected by other microphones.

According to the invention described in claim 8, there is provided a program causing a computer to function as a sound collection unit that collects an environmental sound outside a vehicle with plural microphones, and a processing unit that amplifies the environmental sound collected by the electrical signal the sound collection unit and causing the amplified sound to be output to an inside of the vehicle. The processing unit sets an amplification factor of the environmental sound collected by some microphones to be different from an amplification factor of the environmental sound collected by other microphones.

BRIEF DESCRIPTION OF THE DRAWINGS

The above-described and other objects, features, and advantages will become more apparent from the following description of a preferred embodiment and the accompanying drawings.

FIG. 3 is a schematic diagram illustrating an example of information processed by the processing device in the embodiment.

DESCRIPTION OF EMBODIMENTS

Hereinafter, an embodiment of the present invention will be described with reference to the drawings. In all the drawings, similar components are denoted by similar reference signs, and descriptions thereof will be appropriately omitted.

Outline of Embodiment

According to an embodiment, a processing device may be, for example, an in-vehicle device built in a vehicle or may be a portable terminal (for example, smartphone, tablet, portable phone) brought into a vehicle. The processing device includes a sound collection unit and a processing unit. The sound collection unit collects an environmental sound outside a vehicle (may be referred to as "a sound outside a vehicle" below) with plural microphones and converts the sound into an electrical signal. The processing unit amplifies the environmental sound collected by the sound collection unit and causes the amplified sound to be output to an inside of the vehicle. The processing unit sets an amplification factor of an environmental sound collected by some microphones to be different from an amplification factor of an environmental sound collected by other microphones.

According to such a processing device in the embodiment, it is possible to output a sound outside a vehicle from a speaker installed in the vehicle, in a state where a sound to be output with a relatively large volume and a sound to be output with a relatively small volume are appropriately selected from among sounds collected by plural microphones, and thus, a sound of a desired sound source (sound of which notification to a driver is desired) remains while sounds of other sound sources (sound of which notification to the driver is unnecessary) is reduced.

Details of Embodiment

Figure 1:
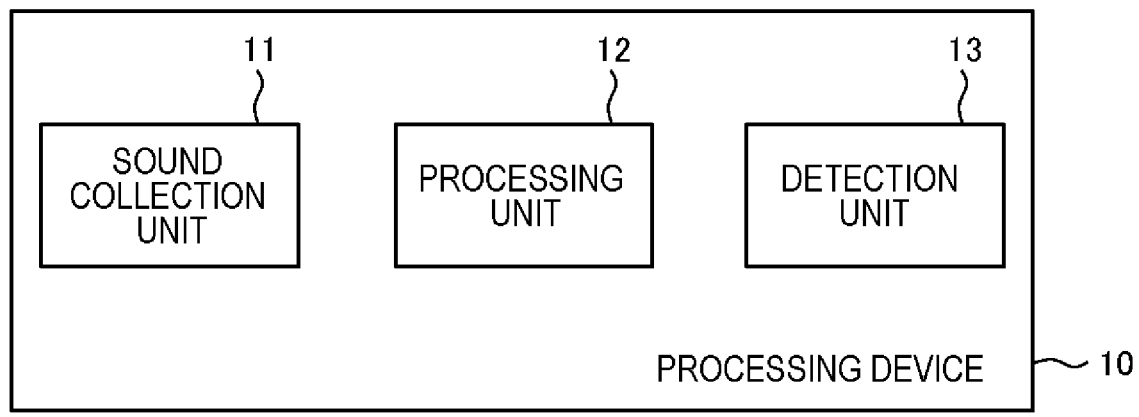
FIG. 1 is a diagram illustrating an example of a functional block diagram of a processing device according to an embodiment.

Next, a configuration of the processing device in the embodiment will be described in detail. FIG. 1 illustrates an example of a functional block diagram of a processing device 10 according to the embodiment. As illustrated in FIG. 1, in the embodiment, the processing device 10 includes a sound collection unit 11, a processing unit 12, and a detection unit 13.

The functional units illustrated in the functional block diagram are realized by any combination of hardware and software. The combination is basically constituted by a central processing unit (CPU) of any computer, a memory, a program loaded in the memory, a storage unit (can store a program which has been stored, in advance, in a stage of shipping the device and a program downloaded from a storage medium such as a compact disc (CD) or from a server on the Internet) such as a hard disk, that stores the program, and a network connection interface. Those skilled in the art will understand that there are various modifications of the realization method and the apparatus.

Figure 2:
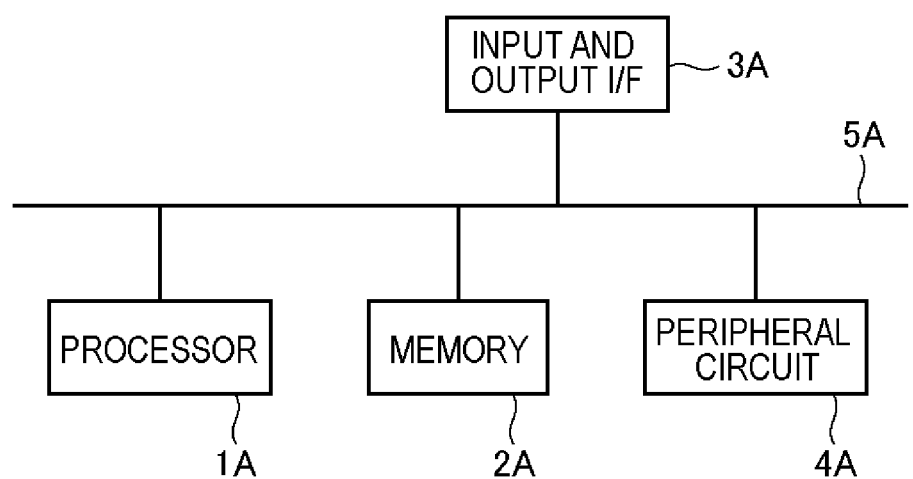
FIG. 2 is a block diagram illustrating an example of a hardware configuration of the processing device in the embodiment.

FIG. 2 is a block diagram illustrating a hardware configuration of the processing device 10 in the embodiment. As illustrated in FIG. 2, the processing device 10 includes a processor 1A, a memory 2A, an input and output interface 3A, a peripheral circuit 4A, and a bus 5A. The peripheral circuit 4A includes various modules. The peripheral circuit 4A may not be provided.

The bus 5A is a data transmission path on which the processor 1A, the memory 2A, the peripheral circuit 4A, and the input and output interface 3A transmit and receive data to and from each other. The processor 1A is an arithmetic processing device such as a central processing unit (CPU) or a graphics processing unit (GPU), for example. The memory 2A is a memory such as a random access memory (RAM) or a read only memory (ROM), for example. The input and output interface 3A includes, for example, an interface for acquiring information from an input device (for example, keyboard, mouse, and microphone), an external device, an external server, an external sensor, and the like, and an interface for outputting information to an output device (for example, display, speaker, printer, and emailer), an external device, an external server, and the like. The processor 1A can output a command to each module and perform an operation on the basis of operation results.

The functions of the functional units illustrated in the functional block diagram in FIG. 1 will be described in detail.

The detection unit 13 detects the current position of the own vehicle. "The own vehicle" means a vehicle in which the processing device 10 is built (the same below). As means for acquiring the current position, for example, using a global positioning system (GPS) is considered. It is not limited thereto.

The sound collection unit 11 collects an environmental sound outside the vehicle and converts the sound into an electrical signal. The sound collection unit 11 includes plural microphones. The plural microphones are installed at any positions at which sounds outside the vehicle are collected. For example, four microphones may be installed at four places, that is, the right front, the left front, the right rear, and the left rear of the own vehicle.

The processing unit 12 amplifies the environmental sound collected by the sound collection unit 11 and causes the amplified sound to be output to an inside of the vehicle. That is, the processing unit 12 causes the sound outside the vehicle to be output via an amplifier and the speaker installed in the vehicle, on the basis of the electrical signal generated by the sound collection unit 11. The processing unit 12 performs predetermined processing on the electrical signal generated by the sound collection unit 11. For example, the processing unit 12 may perform filtering on the electrical signal with a frequency filter selected from plural frequency filters. The processing unit 12 may perform gain adjustment (amplification processing, attenuation processing, and the like) on the electrical signal. In a case where the sound is collected with the plural microphones, the processing unit 12 may perform processing (synthesis of plural sounds collected by the plural microphones) of synthesizing plural acoustic waves respectively corresponding to the plural microphones. The processing unit 12 may perform another kind of processing on the electrical signal.

The processing unit 12 causes a sound outside the vehicle to be output via the speaker installed in the vehicle, on the basis of the signal after the above-described processing. The processing unit 12 causes the sound collected by the sound collection unit 11, to be output from the speaker in real time. Preferably, time loss from sound collection to an output is as small as possible. The number of speakers and the installation position are design matters.

Here, filtering which can be performed by the processing unit 12 will be described. The processing unit 12 performs filtering with a frequency filter that causes a component having a certain frequency band to pass therethrough and reduces components having other frequency bands.

The plural frequency filters have frequency bands to be reduced, which are different from each other. For example, the plural frequency filters may include one or a plurality of "a frequency filter that causes a component having a frequency band corresponding to a human voice to pass therethrough and reduces components having other frequency bands", "a frequency filter that causes a component having a frequency band corresponding to a voice of a human child to pass therethrough and reduces components having other frequency bands", "a frequency filter that causes a component having a frequency band corresponding to a sound (for example, brake sound, bell sound, and wheel rotation sound) of a bicycle to pass therethrough and reduces components having other frequency bands", "a frequency filter that causes a component having a frequency band corresponding to a sound of an ocean wave to pass therethrough and reduces components having other frequency bands", and "a frequency filter that causes a component having a frequency band corresponding to a song of a bird to pass therethrough and reduces components having other frequency bands". The exemplified frequency filters are just examples, and the invention is not limited thereto.

The processing unit 12 can select the frequency filter on the basis of the current position detected by the detection unit 13. For example, the processing unit 12 may specify an attribute of the current position (position attribute). The processing unit 12 may select the frequency filter corresponding to the specified position attribute. An example of the processing will be described below.

For example, the processing unit 12 may specify a position attribute of the current position on the basis of map information indicating attributes of each position (position attributes). Examples of the position attribute include "school zone", "bicycle traffic volume is large", "along the seaside", and "a song of a bird is heard". However, the invention is not limited thereto. In the map information, one position attribute may be associated with a certain position, or plural position attributes may be associated with a certain position. A position which is not associated with the position attribute may be provided.

The processing unit 12 selects the frequency filter corresponding to the specified position attribute of the current position. For example, as illustrated in FIG. 3, the processing unit 12 may hold correspondence information in which the position attribute and an identifier (ID) of the frequency filter are associated with each other. The processing unit 12 may select the frequency filter corresponding to the position attribute of the current position on the basis of the correspondence information.

A frequency filter corresponding to "position attribute: school zone" may be, for example, "the frequency filter that causes a component having a frequency band corresponding to a voice of a human child to pass therethrough and reduces components having other frequency bands". A frequency filter corresponding to "position attribute: bicycle traffic volume is large" may be, for example, "the frequency filter that causes a component having a frequency band corresponding to a sound (for example, brake sound, bell sound, and wheel rotation sound) of a bicycle to pass therethrough and reduces components having other frequency bands".

A frequency filter corresponding to "position attribute: along the seaside" may be, for example, "the frequency filter that causes a component having a frequency band corresponding to a sound of an ocean wave to pass therethrough and reduces components having other frequency bands". A frequency filter corresponding to "position attribute: a song of a bird is heard" may be, for example, "the frequency filter that causes a component having a frequency band corresponding to a song of a bird to pass therethrough and reduces components having other frequency bands".

The processing unit 12 performs filtering the electrical signal generated by the sound collection unit 11, with the frequency filter selected in the above-described manner, for example.

Although not illustrated in FIG. 3, the processing unit 12 may hold correspondence information in which a combination of plural position attributes is associated with an identifier (ID) of the frequency filter. For example, the frequency filter may be associated with a combination of "position attribute: school zone" and "position attribute: bicycle traffic volume is large". The frequency filter may be "a frequency filter that causes the component having a frequency band corresponding to a voice of a human child and the component having a frequency band corresponding to a sound (for example, brake sound, bell sound, and wheel rotation sound) of a bicycle to pass therethrough and reduces components having other frequency bands".

In a case where plural position attributes are associated with the current position, the processing unit 12 can select a frequency filter corresponding to a combination of the plural position attributes.

In a case where the current position is not associated with any position attribute, the processing unit 12 may not select the frequency filter. In this case, the sound outside the vehicle may be output from the speaker without having filtering performed thereon.

In the meantime, as described above, the sound which passes through the frequency filter and then is output from the speaker, that is, a sound of which the driver is notified varies depending on the position attribute of the current position. For example, a notification of a voice of a child is performed in a school zone. A notification of a sound of a bicycle is performed at a position at which the bicycle traffic volume is large. A notification of a sound of an ocean wave is performed at a position along the seaside. A notification of a song of a bird is performed at a position at which the song of a bird is heard.

As described above, plural kinds of sounds (for example, human talking voice, sound of bicycle, sound of an ocean wave, and a song of a bird) of which the driver is to be notified may be provided. However, the volumes of sounds emitted from sound sources are different from each other.

The processing unit 12 may change the amplification factor of a signal input to the speaker in accordance with the position attribute of the current position (that is, in accordance with the current position). The amplification factor has a value which is equal to or greater than 0. Specifically, the processing unit 12 may set the amplification factor such that the driver can be notified of a sound of which the driver is notified at the current position, with an appropriate volume (not too large and not too small).

The processing unit 12 can set an amplification factor of an environmental sound collected by some microphones to be different from an amplification factor of an environmental sound collected by other microphones. That is, the processing unit 12 can set an amplification factor of a signal which is obtained by collection with some microphones (microphones in a first group) and is input to the speaker to be different from amplification factors of signals which are obtained by collections of other microphones (microphones in a second group) and are input to the speaker.

For example, the processing unit 12 can determine the some microphones (microphones in the first group) on the basis of the current position of the own vehicle. That is, the processing unit 12 can group the plural microphones into the first group and the second group on the basis of the current position of the own vehicle.

For example, in a case where the position attribute of the current position of the own vehicle is "along the seaside", the processing unit 12 may set the amplification factor of a signal of a sound collected by the microphone positioned on a side on which the ocean exists to be larger than the amplification factor of a signal of sounds collected by other microphones. For example, in a case where the ocean is located on the right side of the own vehicle, the processing unit 12 may classify the microphones located on the right side (for example, right front and right rear) of the own vehicle to be the first group and classify the microphones located on the left side (for example, left front and left rear) of the own vehicle to be the second group. In this manner, the amplification factor of a signal of the sound collected by the first group may be set to be greater than the amplification factor of a signal of the sound collected by the second group.

For example, the processing unit 12 can determine the some microphones (microphones in the first group) on the basis of the surrounding circumstances of the own vehicle. That is, the processing unit 12 can group the plural microphones into the first group and the second group on the basis of the surrounding circumstances of the own vehicle. The processing unit 12 may adjust a volume level in accordance with the surrounding circumstances.

For example, the processing unit 12 may classify microphones that collect a sound having a volume which is equal to or larger than a reference value among the plural microphones, into the second group and classify others into the first group. The sound collected by the second group may be output to be smaller than the sound collected by the first group. According to this configuration, for example, only a sound in a direction in which the volume of the sound is very large can be adjusted to be equal to or smaller than the volume of a level similar to the sound in other directions. As a result, it is possible to reduce an occurrence of a problem that other sounds are not heard due to being buried in a very loud sound.

In addition, for example, the processing unit 12 may classify microphones attached to the front of the own vehicle among the plural microphones into the second group and classify others into the first group. The sound collected by the second group may be output to be smaller than the sound collected by the first group. It is easy to visually recognize the front of the own vehicle. Therefore, the priority of notifying the driver of a sound in this direction can be set to be lower than the priorities of notifying the driver of sounds in other directions.

For example, the processing unit 12 may classify microphones that easily collect a sound in a direction of a line of sight of the driver in comparison to other microphones among the plural microphones into the second group and classify others into the first group. For example, in a case where the driver sees the right front, the microphone attached to the right front of the vehicle is classified into the second group. The priority of notifying the driver of a sound in a direction which is visually recognized by the driver can be set to be lower than the priorities of notifying the driver of sounds in other directions. Means for detecting the direction of a line of sight of the driver can be realized on the basis of a technology in the conventional art. For example, the direction of a line of sight of the driver may be detected by analyzing an image of the driver, which has been captured by a camera.

Next, an example of a processing flow of the processing device 10 in the embodiment will be described.

Figure 4:
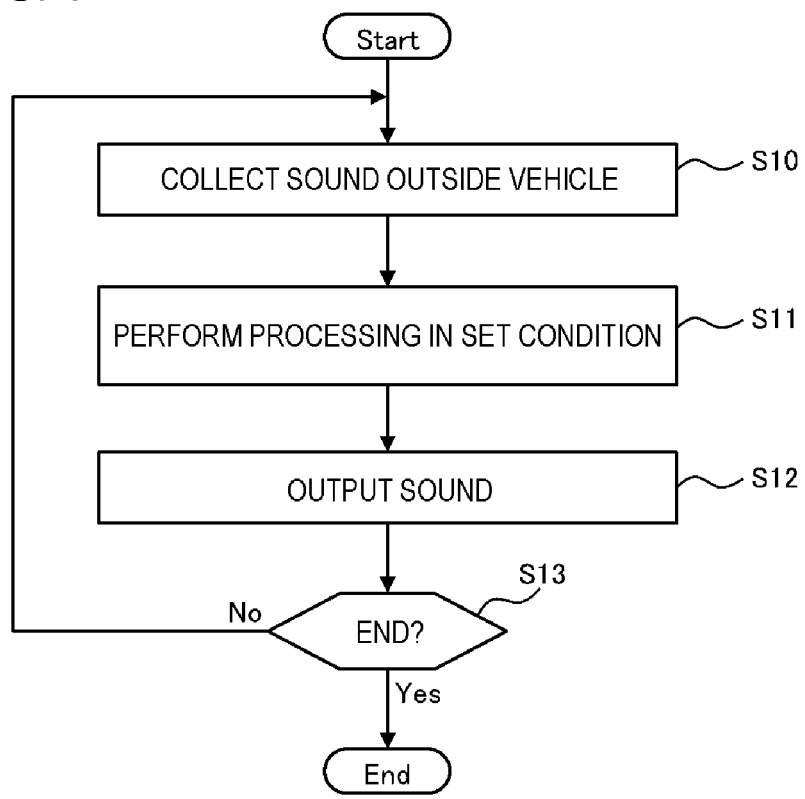
FIG. 4 is a flowchart illustrating an example of a processing flow of the processing device in the embodiment.

As illustrated in FIG. 4, if processing of outputting a sound outside the vehicle from the speaker is disclosed started, the sound collection unit 11 collects the sound outside the vehicle (S10).

The processing unit 12 performs processing on the electrical signal generated by the sound collection unit 11, in a set condition. For example, the processing unit 12 adjusts the gain for the electrical signal generated by each of the plural microphones in a condition set to correspond to the microphone. The processing unit 12 synthesizes plural acoustic waves which respectively correspond to the plural microphones, on the basis of the electrical signal after the gain is adjusted.

After S11, the processing unit 12 causes the sound outside the vehicle to be output from the speaker on the basis of the processed electrical signal (S12).

Figure 5:
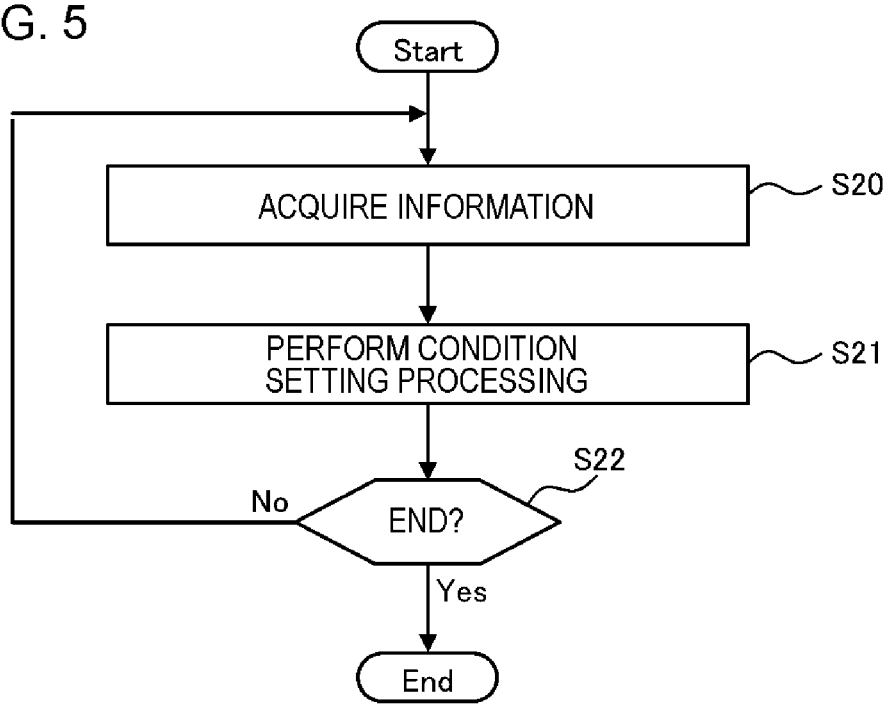
FIG. 5 is a flowchart illustrating an example of a processing flow of the processing device in the embodiment.

Next, an example of processing of changing the set condition will be described with reference to the flowchart in FIG. 5.

The detection unit 13 continues processing of acquiring information for setting the condition. For example, the detection unit 13 acquires information indicating the current position of the own vehicle, information indicating the direction of a line of sight of the driver, information indicating the volume of the sound collected by each of the plural microphones, and the like.

The processing unit 12 determines and sets the condition on the basis of the latest information (S21). That is, the processing unit 12 classifies the plural microphones into the first group and the second group on the basis of the latest information. The condition of adjusting the gain for each group is set.

Next, advantageous effects of the embodiment will be described.

According to the processing device 10 in the embodiment, it is possible to output a sound outside the vehicle from the speaker installed in the vehicle, in a state where a sound of a desired sound source (sound of which notification to a driver is desired) remains while sounds of other sound sources (sounds of which notification to the driver is unnecessary) is reduced, by selecting the frequency filter and performing filtering with the selected frequency filter. According to the above-described processing device 10 in the embodiment, it is possible to reliably notify the driver of the desired sound outside the vehicle in comparison to a technology in the conventional art.

The processing device 10 in the embodiment can select the frequency filter on the basis of the current position. According to the above-described processing device 10, it is possible to appropriately select a sound to remain and a sound to be reduced, in accordance with the current position and output the sound outside the vehicle from the speaker installed in the vehicle.

Multiple sounds of which the driver is to be notified are provided. In a case of a frequency filter that causes all the sounds to pass therethrough, most of the sounds pass through the filter, resulting in a poor filter-effect. In a case of the embodiment, it is possible to narrow down a sound of which the driver is to be notified and select a frequency filter that causes the sound to pass therethrough, in accordance with the current position. Therefore, it is possible to reliably notify the driver of a sound of which the driver is to be notified at each place, in comparison to the technology in the conventional art.

The processing device 10 in the embodiment can change the amplification factor of a signal input to the speaker, in accordance with the current position. Multiple sounds of which the driver is to be notified are provided, and the volumes of the sounds emitted from sound sources are different from each other. Therefore, if the amplification factor of a signal input to the speaker is set to be constant, a situation in which a certain sound can be heard at an appropriate volume, but hearing other sounds has difficulty, or other sounds are heard too loud may occur.

If hearing the sound has difficulty, a problem in that the driver misses the sound may occur. If the sound is too loud, the sound may disturb driving. In addition, if the sound is too loud, the driver changes the volume of the speaker to be reduced. However, after that, a problem in that hearing a predetermined sound has difficulty may occur.

According to the processing device 10 that can change the amplification factor of a signal input to the speaker in accordance with the current position and make an adjustment so that the sound of which the driver is to be notified at each position can be output from the speaker with an appropriate volume, it is possible to reduce problems as described above.

The processing device 10 in the embodiment can set the amplification factor of a signal which is obtained by collection with some microphones and is input to the speaker to be different from amplification factors of signals which are obtained by collections of other microphones and are input to the speaker. It is possible to group microphones into the some microphones and other microphones in accordance with the current position, the surrounding circumstances, the state of the driver, and the like.

For example, the processing device 10 can set the amplification factor of a signal collected by a microphone that easily collects a sound of which the driver is to be notified (for example, microphone on a side on which a sound source of the sound of which the driver is to be notified is located) to be greater than the amplification factor of a signal of a sound collected by another microphone. According to the above-described processing device 10, it is possible to emphasize the sound of which the driver is to be notified and output the sound from the speaker. As a result, it is possible to reliably notify the driver of a sound of which the driver is to be notified at each place, in comparison to the technology in the conventional art.

The amplification factor of a signal of a sound collected by the microphone that collects a very loud sound can be set to be smaller than the amplification factors of a signal of sounds collected by other microphones. According to the above-described processing device 10, it is possible to reduce a problem that the sound of which the driver is to be notified is not buried by a loud sound. As a result, it is possible to reliably notify the driver of a sound of which the driver is to be notified, in comparison to the technology in the conventional art.

The processing device 10 can set the amplification factor of the signal of the sound collected by a microphone installed in the front of the own vehicle or a microphone that easily collects a sound in the direction of a line of sight of the driver to be smaller than the amplification factor of the signal of the sound collected by another microphone. Regarding the front of the own vehicle or the direction of a line of sight of the driver, the priority of notifying the driver of the sound is lower than priorities of sounds in other directions. By reducing the sound in such a direction, it is possible to more reliably notify the driver of the sound which is emitted from another direction and of which the driver is to be notified.

Modification Examples

Here, modification examples of the processing device 10 in the embodiment will be described. The processing device 10 may associate the set amplification factor with the position information of the own vehicle and the date-and-time information when the amplification factor has set and transmit the resultant of the association to an external server device. The external server device updates map information on the basis of the transmitted information.

Figure 6:
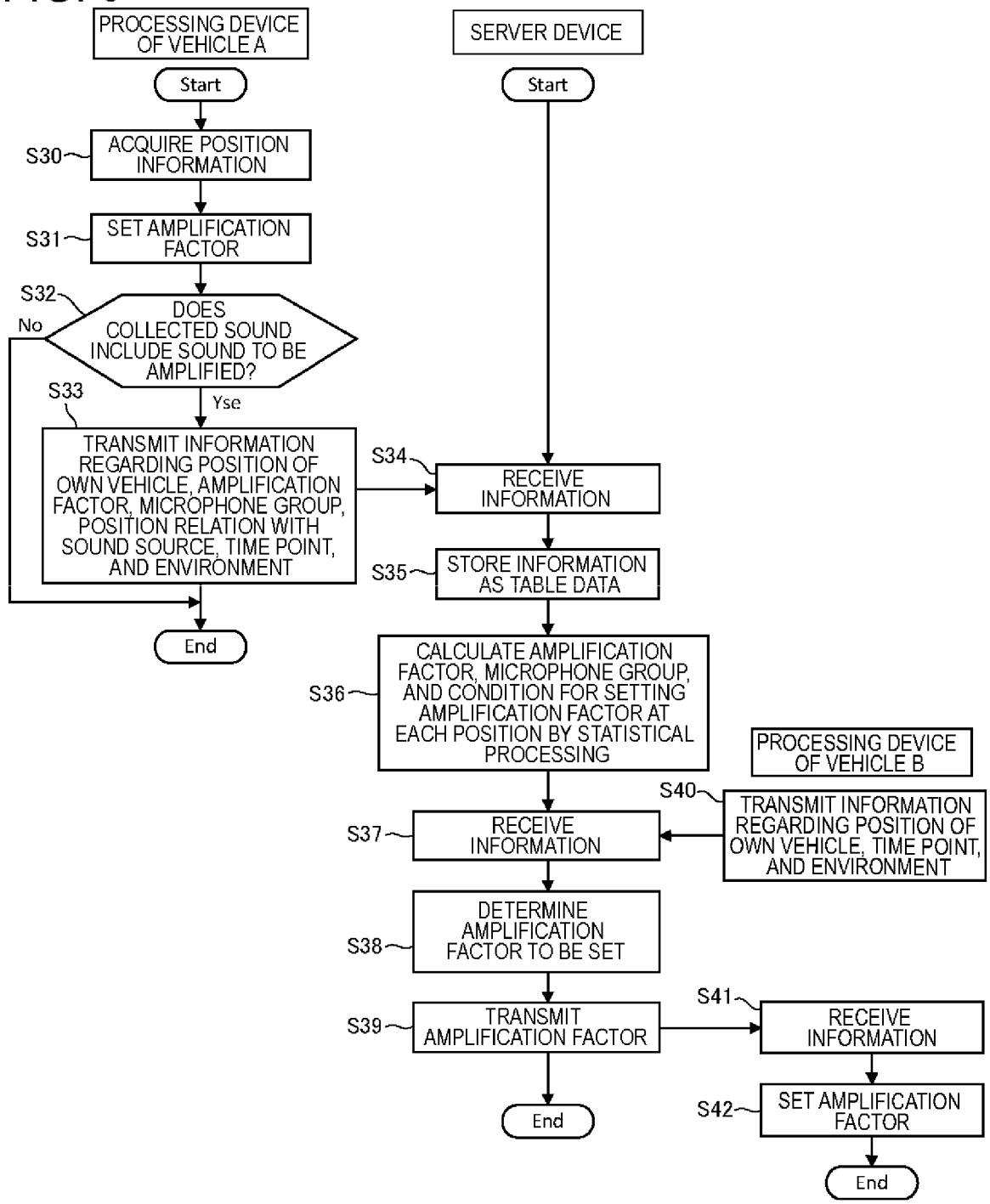
FIG. 6 is a flowchart illustrating an example of a processing flow of the processing device in the embodiment.

An example of a processing flow will be described with reference to the flowchart in FIG. 6. The detection unit 13 of the processing device 10 built in a vehicle A detects the current position of the own vehicle (S30). If the processing unit 12 sets the amplification factor on the basis of the current position (S31), the processing device 10 analyzes a sound collected by the sound collection unit 11. The processing device 10 determines whether or not a sound to be amplified is included in the collected sound and determines a position relation between a sound source and the own vehicle (S32). For example, in a case where the attribute of the current position is "along the seaside", the processing unit 12 determines whether or not the sound of a wave is included and determines a position relation between a sound source of the sound of a wave and the own vehicle.

In a case where the collected sound includes the sound to be amplified (Yes in S32), the processing unit transmits, to the external server device, information of the amplification factor set when the sound is amplified, position information when the amplification factor is set, the group of the microphone of which the signal is to be amplified, date-and-time information or environment information (for example, weather information and traffic information), and the position relation between the own vehicle and the sound source (S33). In a case where the collected sound does not include the sound to be amplified (No in S32), information transmission to the server device is not performed.

The server device receives such information from plural vehicles (S34, acquisition unit) and stores the information along with an identifier (ID) as table data every time the information is received (S35). Statistical processing is performed on the stored table data, and thus one or plural combinations of the amplification factor set for each position, the condition for setting the amplification factor, and the group of the microphone of which the signal is to be amplified is calculated as reference information (S36, generation unit). The calculated reference information may be embedded in the map information.

The processing device 10 built in a vehicle B that sets a new amplification factor transmits the current position information, the current date-and-time information, or the current environment information, as condition information, to the server device and inquires an amplification factor to be set (S40).

If the server device receives the inquiry (S37), the server device determines the amplification factor to be set and the group of the microphone of which the signal is to be amplified on the basis of the reference information generated in S36 and information received in S37 (S38, determination unit). Then, the server device transmits the information to the processing device 10 of the vehicle B (S39).

If receiving the information transmitted from the server device (S41), the processing device 10 of the vehicle B specifies the amplification factor and the group of the microphone of which the signal is to be amplified, which are indicated by the received information. Then, the processing device processes the sound collected by the sound collection unit 11 with the specified contents (S42).

The reference information may be transmitted from the server device to the processing device 10 of each vehicle. Each processing device 10 may determine the amplification factor and the group of the microphone of which the signal is to be amplified, on the basis of the reference information.

Figure 7:
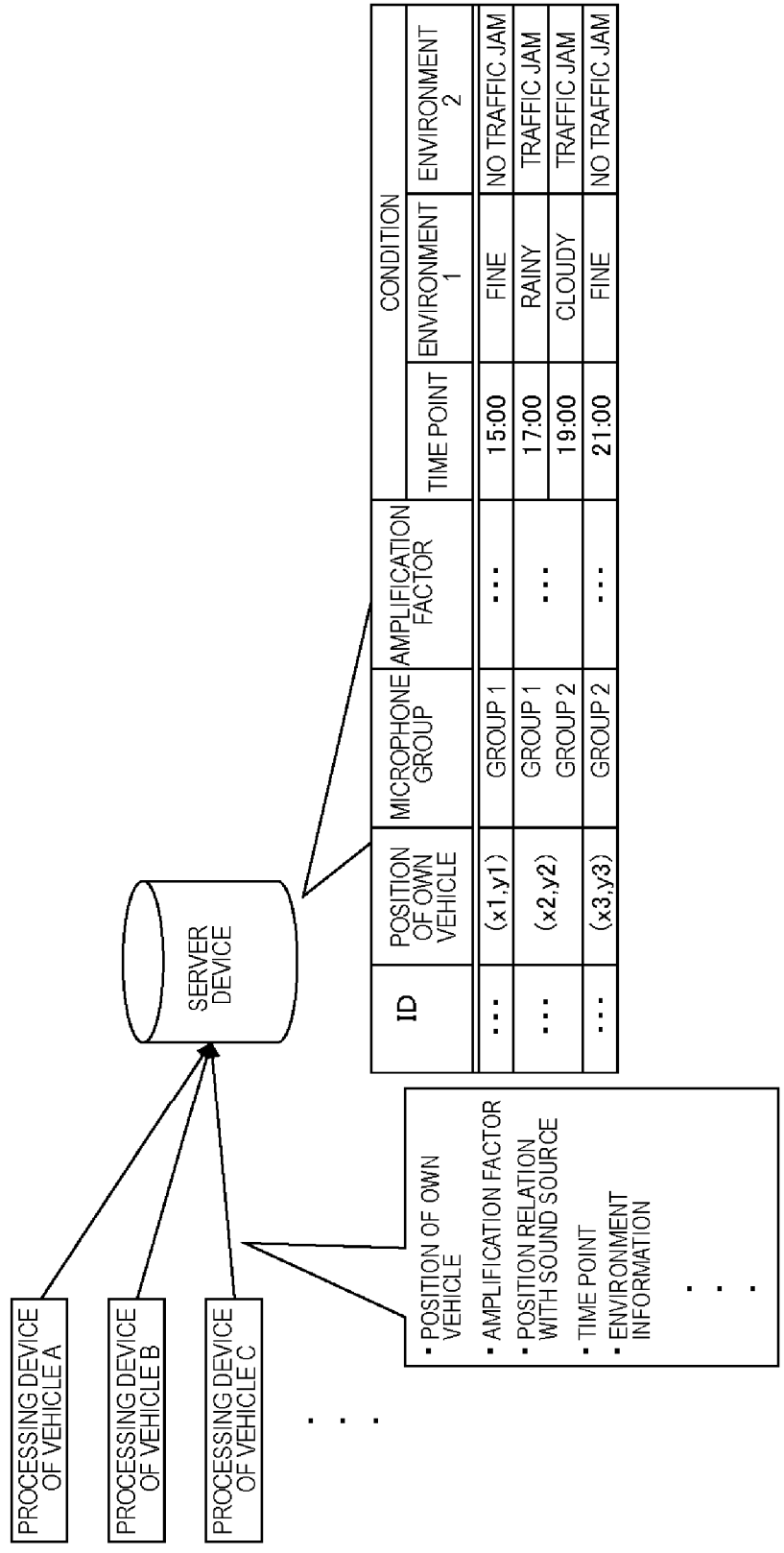
FIG. 7 is a schematic diagram illustrating an example of information accumulated in a server device.

FIG. 7 schematically illustrates an example of information collected in the server device in the modification example. In a case of the modification example, it is possible to set the amplification factor to correspond to the condition of the surrounding environment or a change of a time point, without a need for specifying the direction of a sound source.

Figure 8:
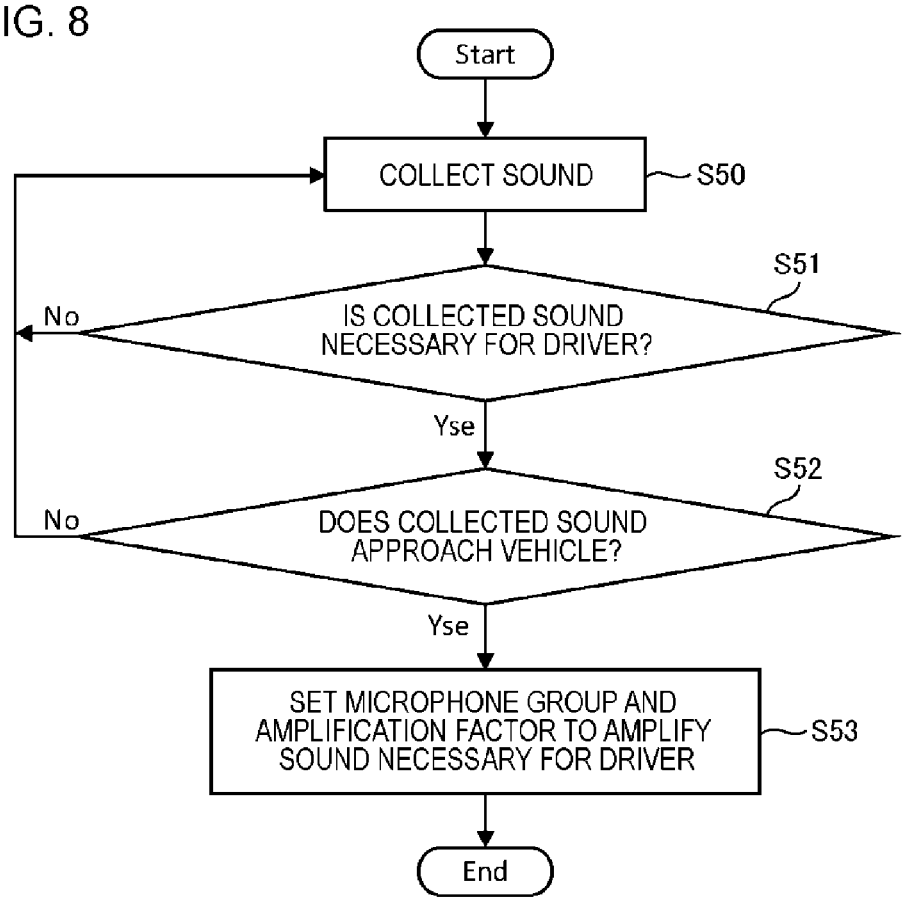
FIG. 8 is a flowchart illustrating an example of a processing flow of the processing device in the embodiment.

Another modification example will be described with reference to the flowchart in FIG. 8. In a case where a sound that needs to be output to the inside of the vehicle is generated in the vicinity of the own vehicle, for example, approach of an emergency vehicle, the processing device 10 sets the amplification factor to emphasize the sound that needs to be output to the inside of the vehicle in accordance with a sound collection state. Specifically, the processing device 10 determines whether or not a sound (S50) collected by the microphone includes a sound that needs to be output to the driver (sound of emergency vehicle, public emergency broadcast, and the like) (S51). In a case where the sound that needs to be output to the driver is included (Yes in S51), the gain of the microphone group located in a direction of a sound source of a sound that needs to be output to the driver is adjusted while the amplification factor set on the basis of the position information of the own vehicle is maintained, in accordance with the situation. For example, in a case where importance for the driver increases with time elapsed, for example, in a case where an emergency vehicle approaches the own vehicle (Yes in S52), the amplification factor of the microphone located in a direction from which the sound that needs to be output to the driver approaches is increased. In a case the importance for the driver decreases with time elapsed, for example, in a case where the emergency vehicle becomes farther (No in S52), the amplification factor is not adjusted. As a result, it is possible to also output an important sound for a passenger of the vehicle to the passenger regardless of the current position of the vehicle. In a case of No in S51, and in a case of No in S52, the amplification factor is determined on the basis of the current position of the own vehicle with the above-described configuration in the embodiment. The type of sound that needs to be output to the driver may be registered in advance.

In a case where authority of driving is transferred from an automatic driving system to a passenger in an automatic driving vehicle, the collected sound may be output into the inside of the vehicle in accordance with the degree of emergency of transferring the authority. For example, in a case where the degree of emergency of transferring the authority is high, an alarm sound is output instead of the collected sound. In a case where the degree of emergency of transferring the authority is low, the collected sound is output. Since the sound outside the vehicle is used instead of the alarm sound in a case of authority transfer having a low degree of emergency, it is possible to naturally transfer authority with small stress.

Hitherto, the embodiment and examples are described with reference to the drawings. However, these are just examples of the present invention, and various other configurations may be employed.

This application claims priority on the basis of Japanese Patent Application No. 2016-208427 filed on Oct. 25, 2016, the disclosure of which is incorporated herein in its entirety.

The invention claimed is:
1. A processing device comprising:
a sound collection unit that collects an environmental sound outside a vehicle with a plurality of microphones;
a processing unit that amplifies the environmental sound collected by the sound collection unit and causes the amplified sound to be output to an inside of the vehicle; and
a detection unit that detects a current position of an own vehicle,
wherein the processing unit filters the environmental sound with a frequency filter selected from among a plurality of frequency filters based on the current position detected by the detection unit, and causes a sound to be output from a speaker installed in the vehicle, on the basis of an electrical signal obtained after the filtering, and wherein the processing unit sets an amplification factor of the environmental sound collected by some microphones to be different from an amplification factor of the environmental sound collected by other microphones.

2. The processing device according to claim 1, further comprising:

a detection unit that detects a current position of an own vehicle, wherein the processing unit determines the some microphones on the basis of the current position.

3. The processing device according to claim 1, further comprising:

a detection unit that detects a current position of the own vehicle, wherein the processing unit sets the amplification factor in accordance with the current position.

4. The processing device according to claim 1, wherein the processing unit determines whether or not to maintain the amplification factor in the plurality of microphones, in accordance with a state of sound collection by the sound collection unit of an external sound that needs to be heard by a passenger of the vehicle, not the sound characterizing the current position when the environmental sound is amplified.

5. A server device comprising:

an acquisition unit that acquires, from each of a plurality of vehicles:

position information of the each of the plurality of vehicles, information of an amplification factor of an environmental sound set at a position indicated by the position information, information of a microphone for which the amplification factor is set, information of a position relation between the each of the plurality of vehicles and the environmental sound, and condition information including at least one of a surrounding environment and a date and time when ones of the plurality of vehicles are located at the position;

a generation unit that generates reference information including:

an amplification factor set at a predetermined position, a microphone as a target for which the amplification factor is set, and a condition for setting the amplification factor, based on the information acquired by the acquisition unit; and a determination unit that determines the amplification factor which is set for another one of the plurality of vehicles based on the position information and the condition information transmitted from the another one of the plurality of vehicles and the reference information.

6. An output method executed by a computer, the method comprising:

a sound collection step of collecting an environmental sound outside a vehicle with a plurality of microphones;

a processing step of amplifying the environmental sound collected by the sound collection unit in the sound collection step and causing the amplified sound to be output to an inside of the vehicle; and a detection step of detecting a current position of an own vehicle, wherein, in the processing step, the environmental sound is filtered with a frequency filter selected from among a plurality of frequency filters based on the detected current position, and causes a sound to be output from a speaker installed in the vehicle, on the basis of an electrical signal obtained after the filtering, and wherein, in the processing step, an amplification factor of the environmental sound collected by some microphones is set to be different from an amplification factor of the environmental sound collected by other microphones.

7. A non-transitory storage medium storing a program causing a computer to function as:

a sound collection unit that collects an environmental sound outside a vehicle with a plurality of microphones;

a processing unit that amplifies the environmental sound collected by the electrical signal the sound collection unit and causing the amplified sound to be output to an inside of the vehicle; and a detection unit that detects a current position of an own vehicle, wherein the processing unit filters the environmental sound with a frequency filter selected from among a plurality of frequency filters based on the current position detected by the detection unit, and causes a sound to be output from a speaker installed in the vehicle, on the basis of an electrical signal obtained after the filtering, and wherein the processing unit sets an amplification factor of the environmental sound collected by some microphones to be different from an amplification factor of the environmental sound collected by other microphones.

* * * * *